United States Patent
Baker (10) Patent No.: US 6,885,580 B2
(45) Date of Patent: Apr. 26, 2005

(54) METHOD FOR REDUCING POWER CONSUMPTION WHEN SENSING A RESISTIVE MEMORY

(75) Inventor: Russel Jacob Baker, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/922,921

(22) Filed: Aug. 23, 2004

(65) Prior Publication Data

US 2005/0018477 A1 Jan. 27, 2005

Related U.S. Application Data

(63) Continuation of application No. 10/400,620, filed on Mar. 28, 2003.

(51) Int. Cl.$^7$ .............................................. G11C 11/00
(52) U.S. Cl. ...................... 365/158; 365/148; 365/205
(58) Field of Search .............................. 365/158, 148, 365/205, 189.07

(56) References Cited

U.S. PATENT DOCUMENTS

| | | | |
|---|---|---|---|
| 5,614,856 A | 3/1997 | Wilson et al. | |
| 6,191,989 B1 | 2/2001 | Luk et al. | |
| 6,317,375 B1 | 11/2001 | Perner | |
| 6,317,376 B1 * | 11/2001 | Tran et al. | 365/210 |
| 6,385,079 B1 | 5/2002 | Tran | |
| 6,385,111 B1 | 5/2002 | Tran et al. | |
| 6,434,049 B1 | 8/2002 | Trivedi et al. | |
| 6,456,525 B1 | 9/2002 | Perner et al. | |
| 6,462,983 B1 | 10/2002 | Katti et al. | |
| 6,804,144 B1 * | 10/2004 | Iwata | 365/158 |
| 2001/0053104 A1 | 12/2001 | Tran et al. | |
| 2002/0021580 A1 | 2/2002 | Katti et al. | |
| 2002/0039309 A1 | 4/2002 | Lu et al. | |
| 2002/0080648 A1 | 6/2002 | Kim | |
| 2002/0085413 A1 | 7/2002 | Trivedi et al. | |
| 2002/0101758 A1 | 8/2002 | Baker | |
| 2003/0090934 A1 * | 5/2003 | Iwata | 365/158 |

FOREIGN PATENT DOCUMENTS

| | | |
|---|---|---|
| EP | 1 132 924 A2 | 12/2001 |
| EP | 1 132 924 A3 | 4/2002 |

* cited by examiner

*Primary Examiner*—Huan Hoang
(74) *Attorney, Agent, or Firm*—Dickstein Shapiro & Morin & Oshinsky LLP (57) ABSTRACT

An apparatus and method is disclosed for reducing power consumption when sensing a resistive memory. A switch, with one end coupled to a terminal of a capacitive element at a node, is coupled from the other end to a bit line from a resistive memory array. A sensing device is further connected to the node, wherein the switch closes and opens to sample and store voltage signals transmitted on the bit line in the capacitive element. The sampled signal is then transmitted to a sensing apparatus that performs sensing operations on the signal.

13 Claims, 7 Drawing Sheets

METHOD FOR REDUCING POWER CONSUMPTION WHEN SENSING A RESISTIVE MEMORY

This application is a continuing application of application serial number 10/400,620 filed Mar. 28, 2003 (now allowed and issue fee paid), which is hereby incorporated by reference.

FIELD OF THE INVENTION

The present invention relates to memory devices, and more particularly to a sensing circuit for sensing the logical state of a resistive memory cell.

BACKGROUND OF THE INVENTION

Figure 1:
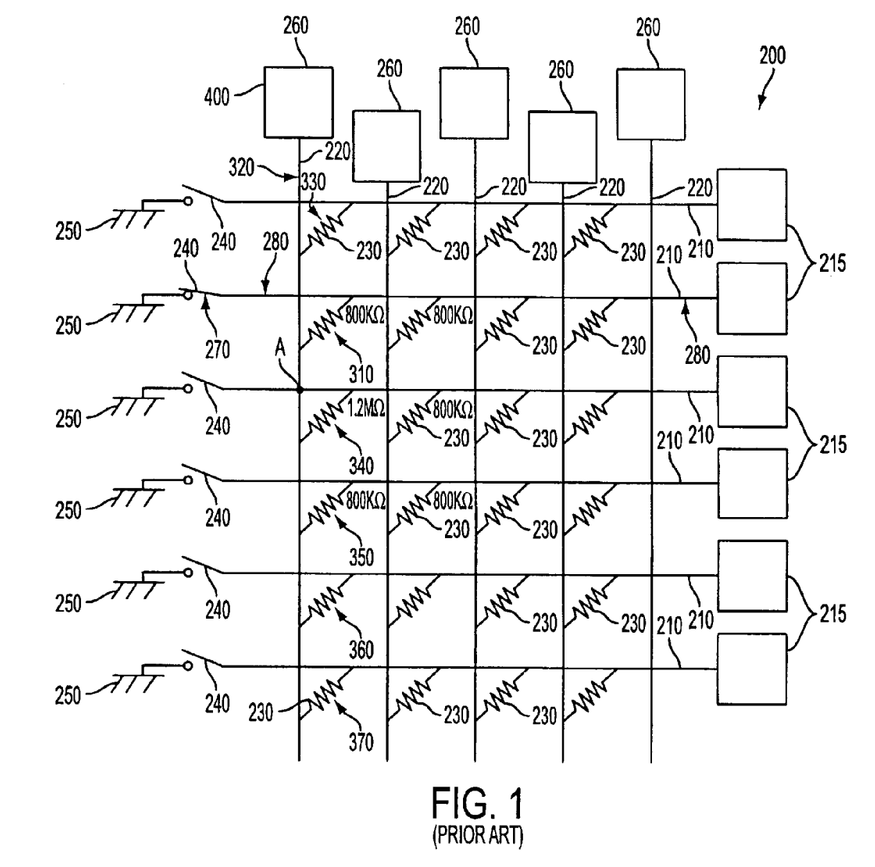
FIG. 1 illustrates a typical resistor-based memory cell array, including resistance sensing circuits.

A resistor-based memory array 200, such as that depicted in FIG. 1, typically contains intersecting row lines 210 and column lines 220 which are interconnected by resistive memory cells 230 at the cross point of the row and column lines. A magnetic random access memory (MRAM) is one example of a memory device which includes resistive memory cells arranged as shown in FIG. 1.

FIG. 1 shows a portion of a resistive memory device. The device includes an array 200 of Magnetic Random Access Memory (MRAM) elements, a plurality of electrically conductive row lines 210, and a plurality of electrically conductive column lines 220. Each row line is connected to each of the plurality of column lines by a respective MRAM resistive element 230. If resistive memory array consists of 1024 rows and 1024 columns, i.e., approximately 1 million cells, and each cell has a resistance of 1.2 MΩ or 800 KΩ, depending on its logic state, the collective resistance when all rows and all columns, except for those associated with the selected cell, are respectively shorted together will be approximately 1KΩ. Typically during the read process, a voltage is impressed across a selected row or cell, resulting in a voltage at node "A," as a result of current flow through memory cell 130 connected to node "A."

A plurality of switches 240, are respectively switchingly connected between one of the row lines and a first source of constant potential (ground) 250. The switches may be implemented as transistors, or may be a form of other programmable switches that are known in the art. A plurality of sensing circuits 260, are respectively connected to the plurality of column lines 220. Each sensing circuit 260 includes a source of constant electrical potential ($V_A$) which is applied to the respective column line. A plurality of pull-up voltage sources 215, supplying voltage $V_A$, are respectively connected to each of the plurality of row lines 210.

In operation, switch 240, such as switch 270 associated with a particular row line 280, is closed so as to bring that row line to the ground potential and a particular column line, e.g., 320 is sensed to read the resistance value of a particular resistor 310.

Figure 2:
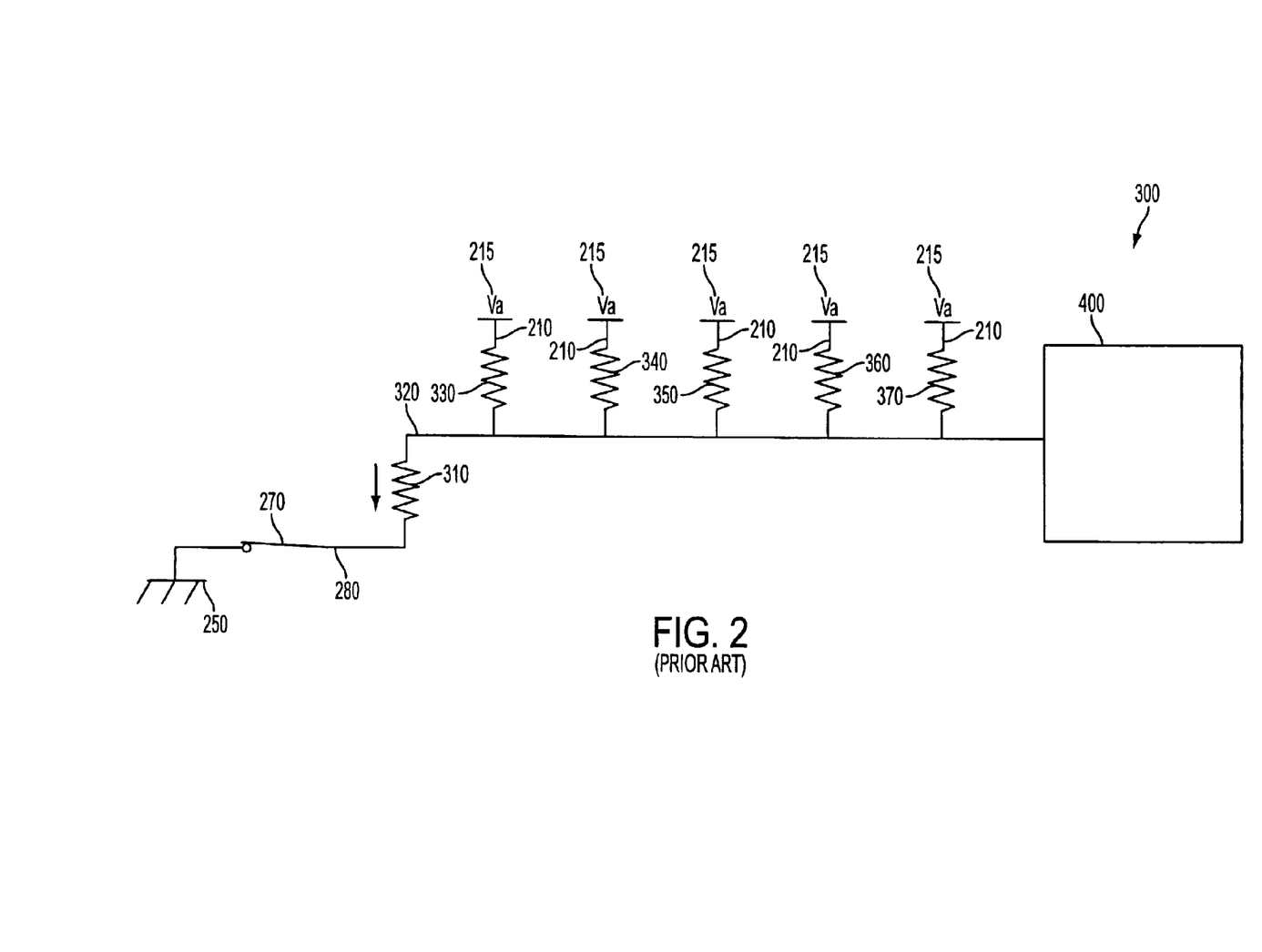
FIG. 2 illustrates a portion of a typical resistor-based memory cell array including a sensing circuit and sneak resistance.

FIG. 2, shows the resulting electrical circuit for the relevant portion 300 of the memory array when row 280 is grounded. As shown, memory element 310 to be sensed is connected between a grounded row line 280 and a particular column line 320. Also connected to the column line 320 are a plurality of other resistive memory elements (e.g. elements 330, 340, 350, 360, 370) each of which is connected at its opposite end to a pull-up voltage source $V_A$ 215 through a respective row line 210. In addition, a sensing circuit 400 is connected to the column line 320. The sensing circuit 400 includes a voltage supply (not shown) that maintains the column line 320 at the potential of the voltage source $V_A$.

The other resistive memory elements (those tied to ungrounded row lines) 330, 340, 350, 360, 370, form an equivalent resistance referred to as sneak resistance. The effective resistance of the sneak resistance is small. A typical value for the sneak resistance might be 1 KΩ. Nevertheless, because both ends of each ungrounded element 320, 340, 350, 360, 370 are ideally maintained at the same potential as the column line 320 (e.g., $V_A$), net current flow through the sneak resistance is desirably nearly zero.

In contrast, a measurable current flows through the grounded resistive memory element 310. This measurable current allows the sensing circuit 400 to evaluate the resistance of the memory element 310 by the sensing circuit 400. Since significant current can flow in a resistive memory array when sensing the value of the memory element, a continuous power draw on the memory array will require a relatively large current draw from a power source.

BRIEF SUMMARY OF THE INVENTION

The present invention provides a method and apparatus for reducing the size of a power source required for a resistive memory array and provides a simplified and reliable method for sensing the resistance of a resistive memory cell of the array. A voltage sensing circuit is utilized, wherein a resistance to be sensed is configured in a voltage divider, formed by the resistance of the sensed cell and the sneak path resistance of non-selected cells. A known voltage is applied across the voltage divider and a resulting voltage drop across the sensed resistance is detected at a bit line of the array. According to the invention, the applied voltage is active for only a portion of a read cycle and the resulting bit line voltage is stored for processing during a further portion of the read cycle. By limiting the time interval during which the applied voltage is active, power dissipation within the memory device is significantly reduced.

The forgoing and other features of the invention will become more apparent from the detailed description of preferred embodiments of the invention given below with reference to the accompanying drawings.

DETAILED DESCRIPTION OF THE INVENTION

The present invention will be described as set forth in exemplary embodiments illustrated in FIGS. 3–8. Other embodiments may be realized and other changes may be made to the disclosed embodiments without departing from the spirit and scope of the present invention.

Figure 3:
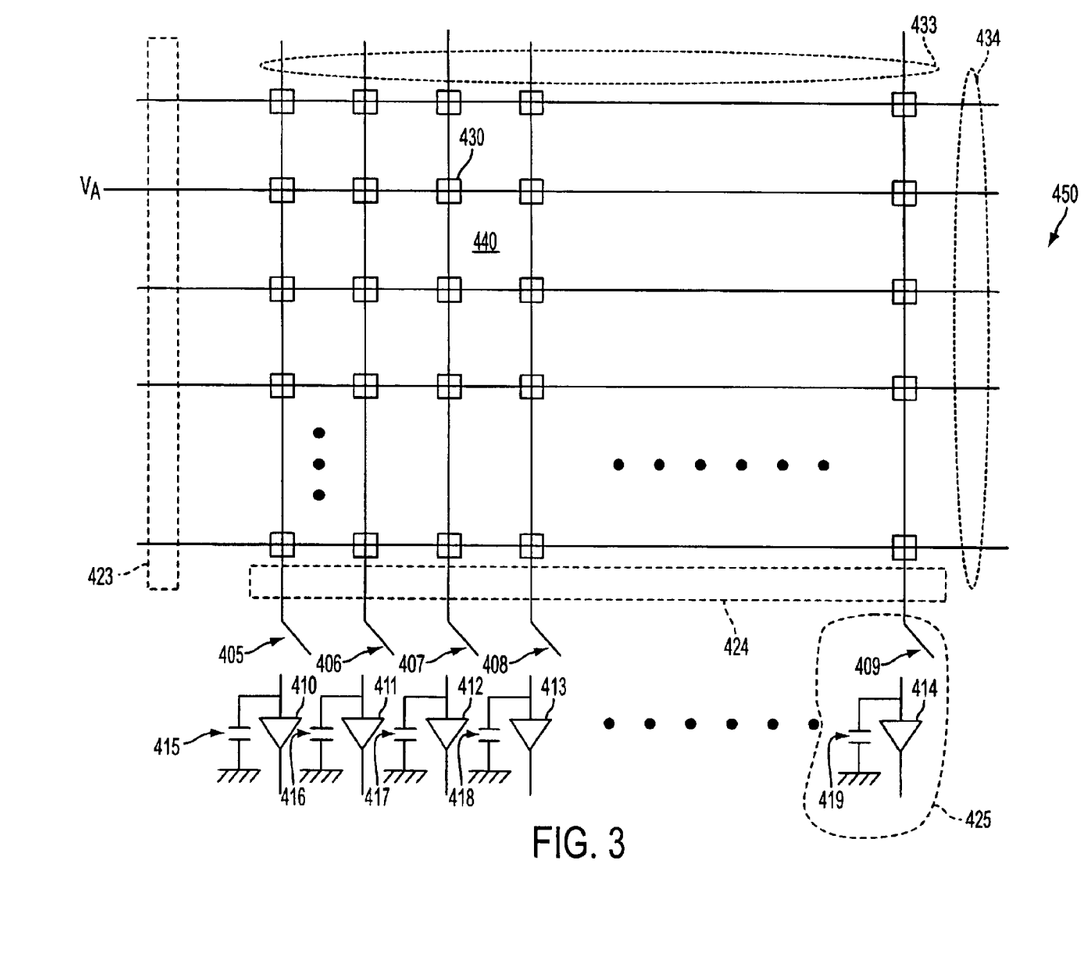
FIG. 3 illustrates a resistive memory array with voltage sensing constructed in accordance with a first exemplary embodiment of the invention.

FIG. 3 illustrates a voltage sensing circuit for a resistive memory array according to a first exemplary embodiment of the invention. A memory array 450 is illustrated, wherein the array 450 has column lines (or "bit" lines) 433 and row lines 434. a row decoder 423 is shown and operates to select one of the row lines 434 during a read operation, while column decoder 424 operates to select one of the column lines 433 for readout. Word lines and column lines are selected through the application of a sense voltage ($V_A$) to a selected line. Typically, all row/column lines will be set to ground, and a selected row will have voltage $V_A$ applied to it.

Figure 4:
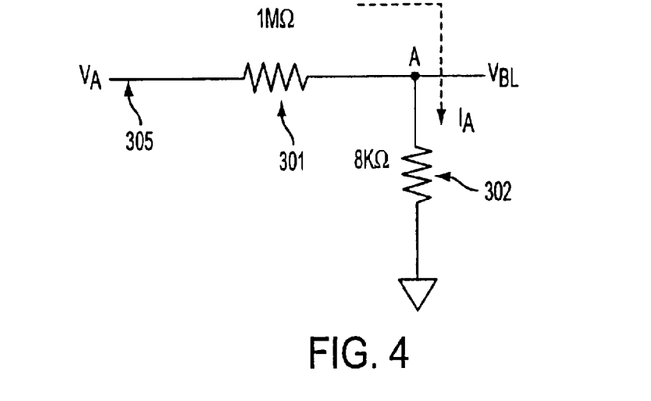
FIG. 4 illustrates a current path along a bitline.

Each memory cell 430 has two possible resistance states, one of which corresponds to a logic value '0' and the other of which corresponds to a logic value '1.' For MRAM cells, the resistance state of a selected memory cell 430 may be set by applying magnetic fields to the selected memory cell. The manner of doing this is well-known in the art and will not be repeated herein. FIG. 4 illustrates an equivalent resistance 302 which represents the resistive value of the non-selected resistive elements coupled to the same column line, which forms a sneak path to ground. The value of resistance 302 is much less than the resistance of sensed cell 301 as the remaining cells connect to the selected column (bit) line are in parallel.

When the applied sense voltage $V_A$ is impressed upon row line 305, a resulting sense current $I_A$ travels along selected row line 305 through resistive memory element 301 and into a first end of resistance 302, which is coupled at a second end to ground. A resulting bit line voltage $V_{BL}$ is then impressed on node "A," which is common to both resistor 301 and resistor 302. Voltage $V_{BL}$ is subsequently sensed. Assuming in the example that the equivalent resistance of memory cell 301 is 1MΩ, and the equivalent resistance of resistance 302 is 8 kΩ, a sense voltage ($V_A$) of approximately 500 mV would result in a sense current ($I_A$) of approximately 0.5 µA in the bit line. Thus, an array containing, for example, 2,000 columns could have a total current draw of 1 mA (2,000×0.5 µA). For 1,000 arrays active at the same time, the total chip current could reach 1 Amp (1,000×1 mA), which is a considerable current draw for an integrated circuit device.

Referring back to FIG. 3, the illustrated embodiment of the invention further contains a plurality of sample-and-hold circuits 425. Each sample-and-hold circuit 425 contains a respective switch 405 . . . 409 provided in series with a respective column (bit) line 433. The switches are typically implemented as transistors. In addition, a plurality of capacitors 415–419 are respectively coupled between each bit line 433 and a ground potential. The capacitors 415–419 may be discreet components, or may also be a parasitic capacitance of a respective sense amplifier 410 . . . 414 which is part of a sample and hold circuit 425, or a parasitic capacitance of a respective bit line 433.

Prior to starting a read operation, the capacitors 415 . . . 419 are equilibrated by applying a known voltage across each capacitor 415 . . . 419. This can be done by temporarily closing each of the switches 405 . . . 409 and applying a pre-charge voltage to each bit line 433. After the capacitors 415 . . . 419 are pre-charged, all switches 405 . . . 409 are opened. Subsequently, during a read operation, a selected row line is set to the voltage $V_a$ and the voltage of a selected column line is sampled by closing a respective one of switches 405 . . . 409 and storing the sampled voltage on a respective capacitor 415 . . . 419. The output of each capacitor 415 . . . 419 is also coupled to a respective sense amplifier 410–414. Thus the voltage stored on a capacitor is available at an input to its respective sense amplifier during the sense operation.

Figure 5:
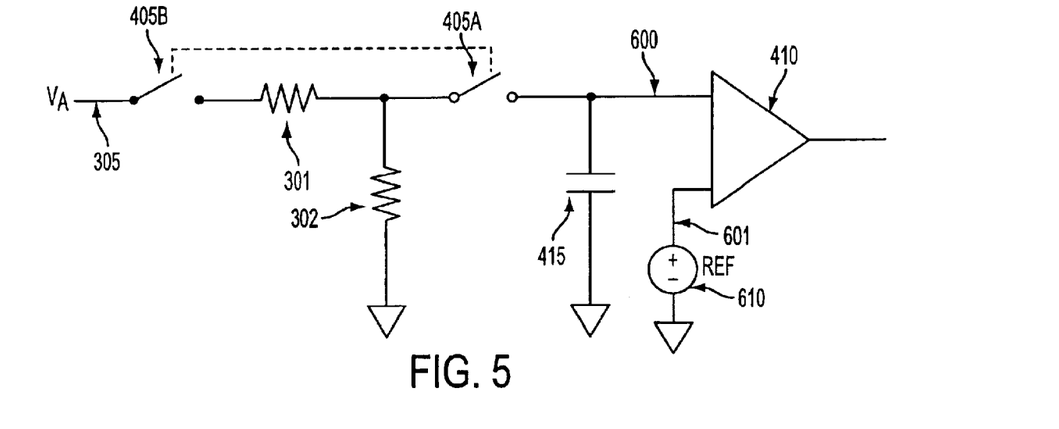
FIG. 5 illustrates an exemplary voltage sensing circuit in accordance with the first embodiment of the invention.
Figure 6:
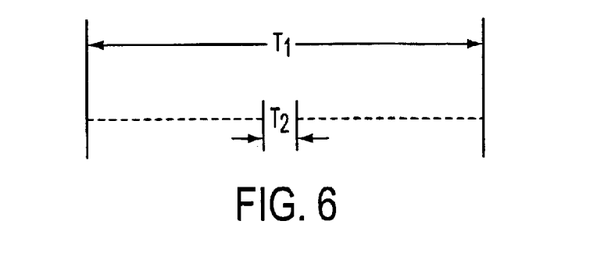
FIG. 6 illustrates a sampled time period wherein voltage is applied at a resistive memory array node.

Turning to FIG. 5, an equivalent circuit is disclosed, showing the sample and hold circuit 425 coupled to a portion of the column line of a selected memory cell. Initially, switch 405 is open during the beginning of a read/sensing period when a voltage $V_a$ is supplied to a selected row, depicted as $T_1$ in FIG. 6. At a predetermined time period after $T_1$, switch 405 closes for a short period $T_2$ and then opens, at which point capacitor 415 is charged by the bit line sense voltage. As can be seen from FIG. 6, the sampling time period $T_2$ is a fraction of the read/sensing period $T_1$ Once charged with the bit line voltage, the capacitor then discharges the sampled sense voltage to input 600 of the sense amplifier 410. A reference voltage 610 is input into the second terminal 601 of sense amplifier 410.—Assuming that a conventional sensing time period $T_1$ lasts 10 µs, sampling the voltage sense for a period of 100 ns would reduce the power from array current by approximately 99%. It is understood that the circuit and method discussed above is equally applicable to a reverse situation, where a voltage is applied to a column line, and the row line is read/sensed.

Figure 7:
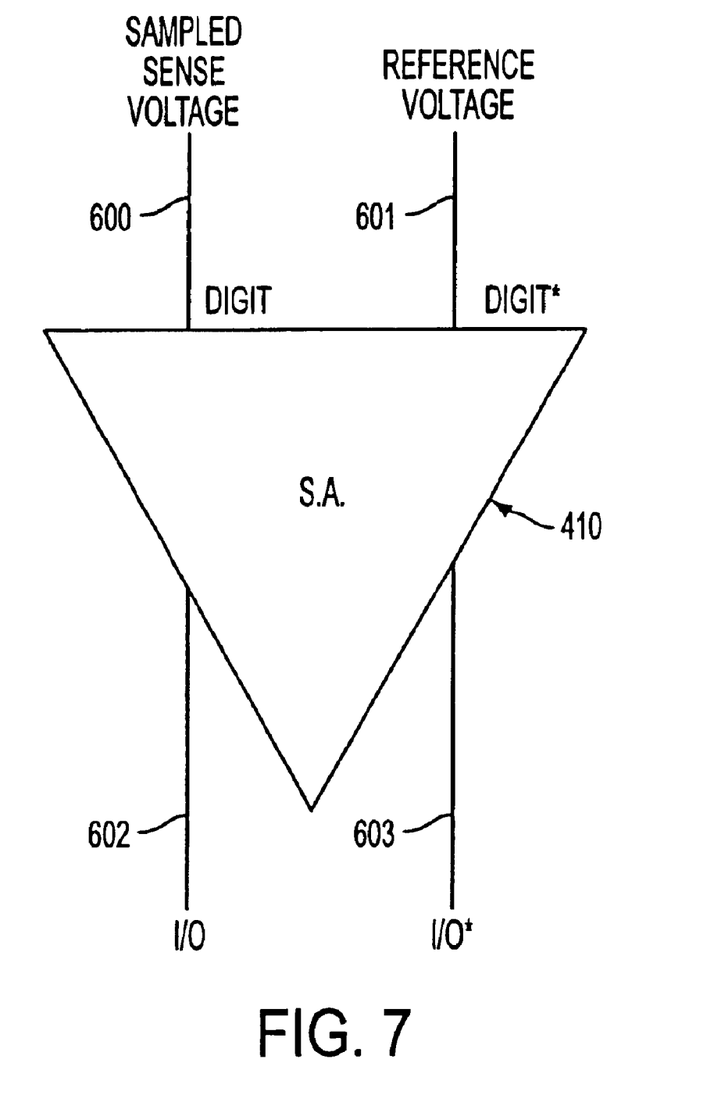
FIG. 7 illustrates the inputs and outputs of a sense amplifier.

An exemplary embodiment of sense amplifier 410 is illustrated in FIG. 7. Sense amplifier 410 has a first input line 600 for receiving the sampled sense voltage measured across a resistor 301 (FIG. 4) of a selected resistor based memory cell 440 (FIG. 3). The first input line 600 may also be referred to as a "Digit" line. Sense amplifier 410 also has a second input line 601 for receiving a reference voltage. The second input line 601 may be referred to as "Digit*." Sense amplifier 410 also has two output lines I/O 602 and I/O* 603. The output lines I/O 602 and I/O* 603 provide complementary outputs depending on whether the voltage on the Digit input line 600 is higher or lower than the voltage on the Digit* input line 601.

The sample-and-hold circuit 425 discussed above can be configured for use with an averaging sense amplifier. An example of such circuitry is provided in the commonly-assigned, co-pending U.S. patent application Ser. No. 10/147,668, filed May 16, 2002, and entitled NOISE RESISTANT SMALL SIGNAL SENSING CIRCUIT FOR A MEMORY DEVICE, which is incorporated herein by reference.

Figure 8:
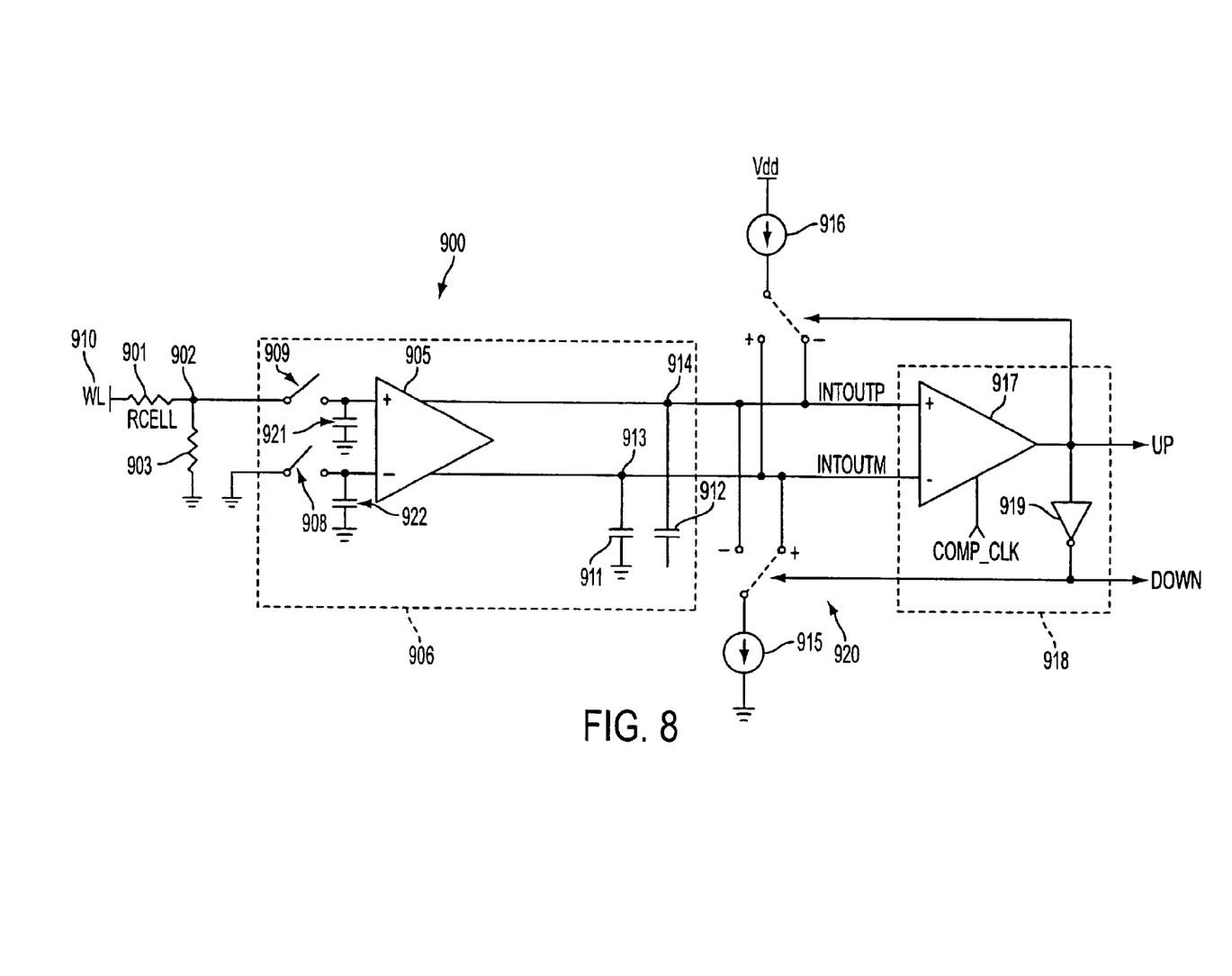
FIG. 8 illustrates a second exemplary embodiment of the invention, wherein the operational amplifier uses sampled voltages for averaging a sense operation.

FIG. 8 illustrates an embodiment of an "averaging" sense circuit which can be used in accordance with the present invention. The illustrated sensing circuit 900 includes an integrator stage 906, a switching current source 920, and a clocked comparator 918. As will be explained in more detail below, an output signal UP (or DOWN) of the sensing circuit 900 is provided to an UP/DOWN counting circuit shown in FIG. 8 and is averaged over a period of time to determine the data state stored in a resistive memory cell 901. The average value calculated is indicative of the data state of the memory cell. Thus, the sensing circuit 900 outputs a stream of UP/DOWN pulses resulting from the cyclical charging and discharging of capacitors 912, 911. The ratio of logic "1" bits (or alternatively, logic '0' bits) to a total number of bits yields a numerical value that corresponds to an average current through a memory cell, such as resistive memory cell 901, in response to an applied voltage. The average current, in turn, is used to determine the logic state of the data stored by the resistive memory cell 901. Circuitry for performing the averaging operation of the pulse stream provided by the sensing circuit 900 has not been shown or described in great detail in order to avoid obscuring the description of the present invention. A more detailed explanation of some of the techniques used in current averaging for memory cell sensing is provided in the commonly assigned, co-pending U.S. patent application Ser. No. 09/938,617, filed Aug. 27, 2001, entitled RESISTIVE MEMORY ELEMENT SENSING USING AVERAGING, which is incorporated herein by reference.

Figure 9:
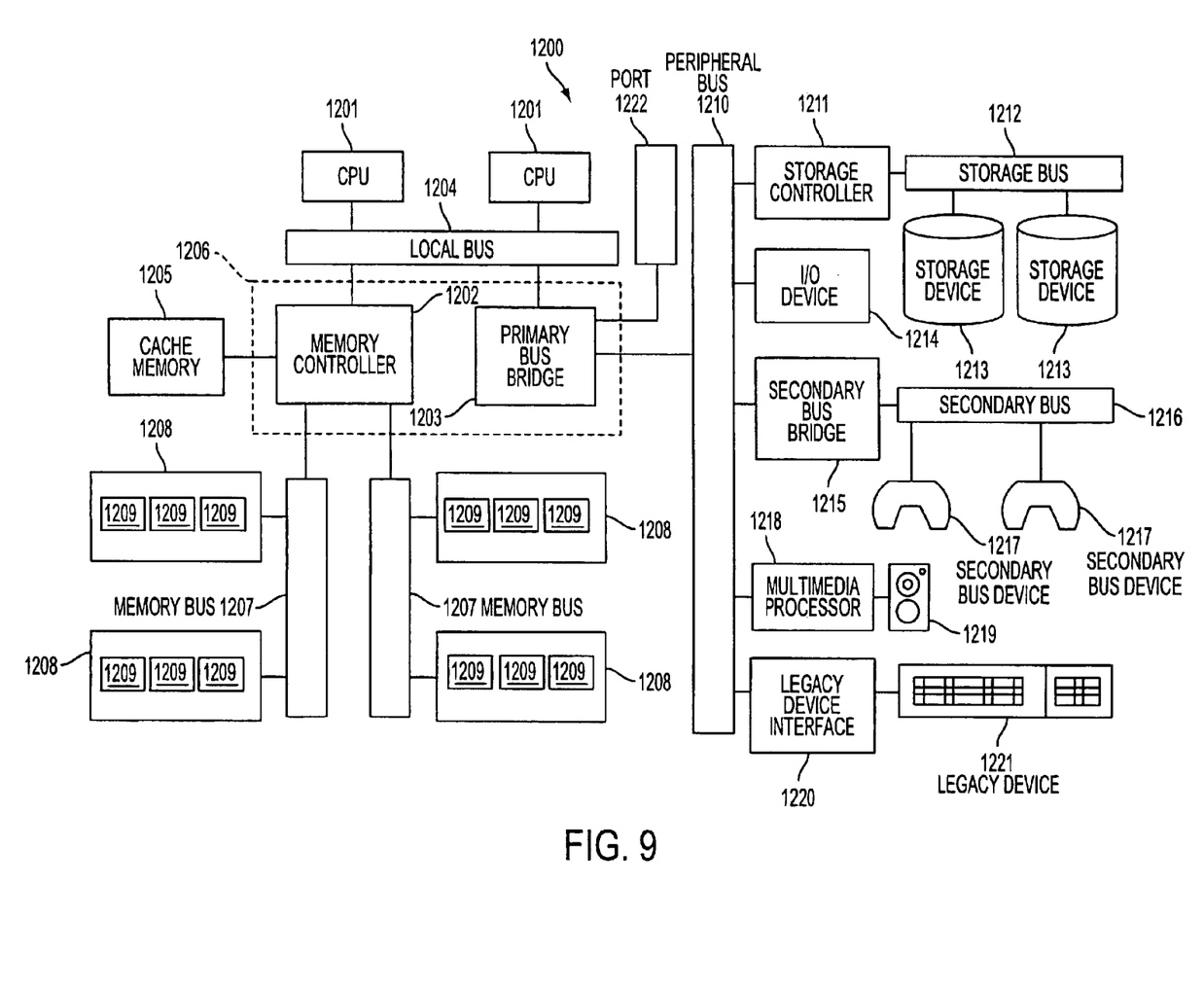
FIG. 9 illustrates an exemplary processing system which utilizes circuits of FIGS. 3–8.

The operation of the sensing circuit 900 is now described generally with respect to FIG. 8. The resistance RCELL of the resistive memory cell 901 is measured as an input voltage relative to ground. In reading a memory cell, a selected row line, or word line (WL) 910 is activated and a voltage $V_A$ is applied to the resistive divider 901,902. All other wordlines in the memory array are grounded. As illustrated in FIG. 9, the voltage level of the selected WL 910 is dropped over the cell resistance 901 and a "sneak" resistance 903 that represents the resistance of the other resistive memory cells of the bit line.

Node 902 is connected to a first switch 909, which is coupled to the positive terminal of differential amplifier 905, and is further coupled to capacitor 921. Switch 908 is coupled to the negative terminal of differential amplifier 905, and further to capacitor 922 as shown in FIG. 8. Switches 909 and 908 close and open during the sample time period $T_2$ following the initiation of a read/sense operation at T1 (as described above with respect to FIGS. 5 and 6), to transfer the charge from node 902 to capacitor 921. The voltage on capacitor 921 is sensed at the positive terminal of amplifier 905. Switch 908, which is coupled to ground, operates at the same time as switch 909 to offset switching noise that may be transmitted to amplifier 905 during a sampling period. The voltage applied to differential amplifier 905 causes the amplifier 905 to supply current to either node 914 or 913, and draw current from the other node. Similar to the first embodiment discussed above, the capacitors 921, 922 may be discrete components, or may be the parasitic capacitance of the differential amplifier or input lines connected thereto. Furthermore, the sampling capacitors 921, 922 are also brought to a known voltage prior to a sensing operation to eliminate the residual charge that may exist in the capacitors.

As a result, the capacitor (911 or 912) coupled to the node to which the differential amplifier 905 is supplying a current will be charged, increasing the voltage of the node. Conversely, the capacitor coupled to the node from which the differential amplifier 905 is drawing current will be discharged, decreasing the voltage of that node. A clocked comparator 917 senses the relative voltages of the nodes 914, 913 in response to a clock signal COMP_CLK and generates a corresponding output signal UP. The clocked comparator 917 also generates a complementary output signal DOWN. As illustrated in FIG. 8, an inverter 919 is coupled to the output of the clocked comparator 917 to generate the DOWN signal. However, it will be appreciated that the clocked comparator 917 is provided by way of example, and a clocked comparator suitable for use with the present invention can be implemented in many different ways other than that shown in FIG. 8.

The UP and DOWN signals are provided to the switching current source 920 having a first current source 916 and a second current source 915. Each of the current sources 916, 915 switch between being coupled to the nodes 914, 913 based on the state of the UP and DOWN signals. In one state, the current source 916 is coupled to the node 914, providing current to positively charge the capacitor 912, and the current source 915 is coupled to the node 913, providing current to negatively charge the capacitor 911. In the other state, the current source 916 is coupled to the node 913, providing current to positively charge the capacitor 911, and the current source 915 is coupled to the node 914, providing current to negatively charge the capacitor 912. Consequently, when the UP and DOWN signals switch states, the coupling of the current sources 916, 915 will switch as well.

For example, as illustrated in FIG. 8, the UP and DOWN signals are LOW and HIGH, respectively, causing the current source 916 to be coupled to the node 914 and the current source to be coupled to the node 913. Upon the next rising edge of the COMP_CLK signal, the voltages of the nodes 914, 913 are sensed by the clocked comparator 917. The voltages at the nodes 914, 913 are represented by signals INTOUTP and INTOUTM, respectively. Where the coupling of the current sources 916, 915 are such that the current provided to the capacitors 912, 911 over the period of the COMP_CLK signal causes the voltages of the nodes 914, 913 to change from the previous rising edge of the COMP_PLK signal, the output of the clocked comparator 917 changes logic states. This in turn causes the coupling of the current sources 916, 915 to switch nodes as well. It will be appreciated that the coupling of the current sources 916, 915 will continue to switch until the current provided by the differential amplifier 905 to either one of the capacitors 912, 911 causes the voltage of the respective node 914, 913 to be greater than the change in voltage caused by the current source over one period of the COMP_CLK signal. When this occurs, the logic states of the UP and DOWN signals maintain their present logic states, which causes the average of the output signal of the sensing circuit 900 to change.

FIG. 9 illustrates an exemplary processing system 1200 which utilizes a reduced power sensing circuit such as, for example, the circuit described in connection with FIGS. 3–8. The processing system 1200 includes one or more processors 1201 coupled to a local bus 1204. A memory controller 1202 and a primary bus bridge 1203 are also coupled the local bus 1204. The processing system 1200 may include multiple memory controllers 1202 and/or multiple primary bus bridges 1203. The memory controller 1202 and the primary bus bridge 1203 may be integrated as a single device 1206.

The memory controller 1202 is also coupled to one or more memory buses 1207. Each memory bus accepts memory components 1208. The memory components 1208 may be a memory card or a memory module. The memory components 1208 may include one or more additional devices 1209. For example, in a SIMM or DIMM, the additional device 1209 might be a configuration memory, such as a serial presence detect (SPD) memory. The memory controller 1202 may also be coupled to a cache memory 1205. The cache memory 1205 may be the only cache memory in the processing system. Alternatively, other devices, for example, processors 1201 may also include cache memories, which may form a cache hierarchy with cache memory 1205. If the processing system 1200 include peripherals or controllers which are bus masters or which support direct memory access (DMA), the memory controller 1202 may implement a cache coherency protocol. If the memory controller 1202 is coupled to a plurality of memory buses 1207, each memory bus 1207 may be operated in parallel, or different address ranges may be mapped to different memory buses 1207.

The primary bus bridge 1203 is coupled to at least one peripheral bus 1210. Various devices, such as peripherals or additional bus bridges may be coupled to the peripheral bus 1210. These devices may include a storage controller 1211, a miscellaneous I/O device 1214, a secondary bus bridge 1215, a multimedia processor 1218, and a legacy device interface 1220. The primary bus bridge 1203 may also be coupled to one or more special purpose high speed ports 1222. In a personal computer, for example, the special purpose port might be the Accelerated Graphics Port (AGP), used to couple a high performance video card to the processing system 1200.

The storage controller 1211 couples one or more storage devices 1213, via a storage bus 1212, to the peripheral bus 1210. For example, the storage controller 1211 may be a SCSI controller and storage devices 1213 may be SCSI discs. The I/O device 1214 may be any sort of peripheral. For example, the I/O device 1214 may be an local area network interface, such as an Ethernet card. The secondary bus bridge may be used to interface additional devices via another bus to the processing system. For example, the secondary bus bridge may be an universal serial port (USB) controller used to couple USB devices 1217 via to the processing system 1200. The multimedia processor 1218 may be a sound card, a video capture card, or any other type of media interface, which may also be coupled to one additional device such as speakers 1219. The legacy device interface 1220 is used to couple legacy devices, for example, older styled keyboards and mice, to the processing system 1200.

The processing system 1200 illustrated in FIG. 9 is only an exemplary processing system with which the invention may be used. While FIG. 9 illustrates a processing architecture especially suitable for a general purpose computer, such as a personal computer or a workstation, it should be recognized that well known modifications can be made to configure the processing system 1200 to become more suitable for use in a variety of applications. For example, many electronic devices which require processing may be implemented using a simpler architecture which relies on a CPU 1201 coupled to memory components 1208 and/or memory devices 1209. The modifications may include, for example, elimination of unnecessary components, addition of specialized devices or circuits, and/or integration of a plurality of devices.

While the invention has been described in detail in connection with preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. For example, although the invention has been described in the context of MRAM, it may be used for sensing the resistive state of other resistive-based memory cells and indeed in any voltage sensing system in which power consumption critical. In addition, while specific values of current, voltage capacitance and resistance have been used to describe the illustrated embodiments, it should be apparent that different values may be used in their place without deviating from the scope of the described embodiments. Accordingly, the invention is not limited by the foregoing description or drawings, but is only limited by the scope of the appended claims.

What is claimed as new and desired to be protected by Letters Patent of the United States is:

1. A memory device, comprising:
    a memory array comprising a plurality of resistive memory cells, each one of said memory cells being coupled to one of a plurality of row lines and one of a plurality of column lines;
    addressing circuitry, for selecting a selected row line and a selected column line;
    a read voltage source, for supplying, via said addressing circuitry, a read voltage to said selected row and column lines during a read/sense period;
    a plurality of sample and hold circuits, each associated with a respective one of said column lines;
    a plurality of sense circuits, each associated with a respective one of said sample and hold circuits;
    a switching circuit,
        said switching circuit operable in a first state to couple said read voltage source with said selected row line while simultaneously coupling said selected column line with an associated one of said sample and hold circuits, and
        said switching circuit operable in a second state to decouple said read voltage source from said selected row line while simultaneously decoupling said selected column line from said associated one of said sample and hold circuits; and
    a control circuit for operating said switching circuit in a said first state after a start of said read/sense period of a memory cell associated with said selected row and column lines, and for operating said switching circuit in said second state before an end of said read/sense period.

2. The memory device of claim 1, wherein said switching circuit comprises a first transistor and a second transistor respectively coupled to said selected row and column lines.

3. The memory device of claim 1, wherein said switching circuit comprises a first programmable switch and a second programmable switch respectively coupled to said selected row and column lines.

4. The memory device of claim 1, wherein each of said sample and hold circuits comprises a capacitive element coupled between an associated one of said column lines and a predetermined voltage source.

5. The memory device of claim 4, wherein said predetermined voltage source is a source of ground potential.

6. The memory device of claim 4, wherein said capacitive element comprises a discrete capacitor.

7. The memory device of claim 4, wherein said capacitive element comprises a parasitic capacitance of an associated one of said sensing circuits.

8. The memory device of claim 4, wherein said capacitive element comprises a parasitic capacitance of said selected column line.

9. The memory device of claim 1, wherein each sense circuit comprises a sense amplifier having a first input coupled to one of said sample and hold circuits and a second input coupled to a reference voltage source.

10. A method for reading a resistive memory device, comprising:
    selecting a memory cell;
    during a read/sense period, applying a read voltage to a row line associated with said memory cell;
    during a sampling period, sampling a voltage signal produced by said memory cell in response to said read voltage; and
    after said sampling period, comparing said sampled voltage with a reference voltage to determine a state of said memory cell;
    wherein said sampling period occurs within said read/sense period, and a duration of said sampling period is less than a duration of said read/sense period.

11. The method of claim 10, wherein said step of sampling comprises:
    transferring said voltage signal from a bit line associated with said memory cell to a capacitive element.

12. The method of claim 10, wherein said read/sense period has a duration of approximately 10 microseconds and said sampling period has a duration of approximately 100 nanoseconds.

13. The method of claim 10, wherein a duration of said read/sense period is approximately one hundred times longer than a duration of said sampling period.

* * * * *

UNITED STATES PATENT AND TRADEMARK OFFICE
CERTIFICATE OF CORRECTION

PATENT NO. : 6,885,580 B2
DATED : April 26, 2005
INVENTOR(S) : R. J. Baker

It is certified that error appears in the above-identified patent and that said Letters Patent is hereby corrected as shown below:

Column 4,
Line 19, "–Assuming" should read -- Assuming --;

Column 7,
Lines 8 and 12, "an" should read -- a --.

Signed and Sealed this

Ninth Day of August, 2005

JON W. DUDAS
*Director of the United States Patent and Trademark Office*